US006448872B2

(12) United States Patent
Rhodes et al.

(10) Patent No.: US 6,448,872 B2
(45) Date of Patent: Sep. 10, 2002

(54) REFLECTION-MODE FILTER AND METHOD WITH A CONSTANT LOSS OFF-SET

(75) Inventors: John Rhodes; Ian Hunter, both of Shipley (GB)

(73) Assignee: Filtronic PLC (GB)

( * ) Notice: Subject to any disclaimer, the term of this patent is extended or adjusted under 35 U.S.C. 154(b) by 0 days.

(21) Appl. No.: 09/795,955

(22) Filed: Feb. 28, 2001

Related U.S. Application Data

(63) Continuation of application No. 09/155,169, filed as application No. PCT/GB97/00786 on Mar. 19, 1997, now abandoned.

(30) Foreign Application Priority Data

Mar. 23, 1996 (GB) ............................................ 9606178

(51) Int. Cl.[7] ................................................ H03H 7/075
(52) U.S. Cl. ......................... 333/167; 333/1.1; 333/206
(58) Field of Search ......................... 333/1.1, 167, 202, 333/206, 175

(56) References Cited

U.S. PATENT DOCUMENTS 4,207,547 A 6/1980 Buck .......................... 333/209
4,538,123 A 8/1985 Mariani et al. ............... 33/208

FOREIGN PATENT DOCUMENTS

GB 2284940 6/1995

OTHER PUBLICATIONS

Rhodes, "A Low–Pass Prototype Network for Microwave Linear Phase Filters," *IEEE Transactions on Microwave Theory and Techniques*, vol. 18, No. 6, New York, pp. 290–301 (Jun. 1970).
Cameron et al. "Extracter–Pole Filter Manifold Muliplexing," *IEEE Transactions on Microwave Theory and Techniques*, vol. 30, No. 7, New York, pp. 1041–1050 (Jul. 1982).
Rhodes et al. "Synthesis of Reflection–Mode Prototype Networks with Dissipative Circuit Elements" *IEE Proc.–Microw. Antennas Propag.*, vol. 144, No. 6, pp. 437–442 (Dec. 1997).

*Primary Examiner*—Justin P. Bettendorf
(74) *Attorney, Agent, or Firm*—Madson & Metcalf

(57) ABSTRACT

A method of producing filters using lower unloaded Q factor components than filters with the same performance characteristics but requiring higher unloaded Q factor components is disclosed. The method includes the steps of defining a desired filter characteristic and applying an algorithm which provides a filter having infinite Q factor elements and having a theoretical characteristic corresponding to the desired characteristic transformed to a compensate for the difference between finite Q factor and infinite Q factor elements.

15 Claims, 8 Drawing Sheets

R1, 2, 3 are unavoidable resonator losses

REFLECTION-MODE FILTER AND METHOD WITH A CONSTANT LOSS OFF-SET

This is a continuation of U.S. application Ser. No. 09/155,169, Jan. 14, 1999 which is a 371 of PCT /GB97/00786, filed Mar. 19, 1997 now abandoned.

BACKGROUND OF THE INVENTION

The present invention relates to filters and to a method and apparatus for manufacturing filters, and relates particularly, but not exclusively, to microwave filters and a method and apparatus for manufacturing microwave filters.

Microwave filters are often constructed from networks of coupled passive resonators, each passive resonator having a finite unloaded Q factor. In narrow bandwidth applications, the resistive loss associated with this finite unloaded Q factor can lead to significant reduction in achievable performance, and in bandpass applications, designs with a good input and output reflection coefficient will exhibit significant bandpass loss variation.

In the narrow band bandstop case the resistive loss manifests itself as a roll off of insertion loss into the pass band, and also limits the achievable notch depth. The combination of these two effects limits the achievable selectivity from a bandstop filter designed using previously available techniques.

In an existing bandstop filter, resonators are coupled off from a main through transmission line with an electrical separation of an odd number of quarter wavelengths, as shown in FIG. 1. Each resonator couples loss into the system, giving rise to the problems outlined above.

In various applications of microwave filters, such as in base stations for cellular telecommunications, the above difficulties are addressed by using components having very high Q factors, typically up to 40,000. However, this increases the physical size of the devices involved, whereas it is usually desirable in such applications to make the devices as compact as possible.

SUMMARY OF THE INVENTION

Preferred embodiments of the present invention seek to provide a filter which, although constructed using finite Q elements, does not suffer from a reduction in selectivity as a result of resistive losses caused by these finite Q factor elements.

Preferred embodiments of the present invention also seek to achieve a desired filter characteristic using components having lower unloaded Q factor than in the case of the prior art.

Preferred embodiments of the present invention also seek to provide a bandstop/pass filter having a steep transition between the stop and pass band and using lower value unloaded Q factor components than in the case of the prior art.

According to an aspect of the present invention, there is provided a method of designing a filter, the method comprising defining a desired filter characteristic, and applying an algorithm to the desired characteristic to provide a filter having infinite Q factor elements and having a theoretical characteristic corresponding to the desired characteristic transformed to compensate for the difference between finite Q factor and infinite Q factor elements.

According to another aspect of the present invention, there is provided a method of manufacturing a filter, the method comprising the steps of designing a filter according to a method as defined above, and constructing using finite Q factor elements a filter corresponding to the theoretical filter.

This provides the advantage of a filter design technique which takes resistive losses of the individual components, such as inductors and-capacitors, of the filter into account, and therefore enables a filter having a desired characteristic to be designed using finite Q value components. This in turn enables a filter having a particular characteristic to be realised using lower unloaded Q factor components than in the case of the prior art, which in turn enables the filter to be constructed more compactly than in the case of the prior art.

According to another aspect of the present invention, there is provided an apparatus for use in manufacturing filters, the apparatus comprising an input means in which a desired filter characteristic is defined in use, and means for applying an algorithm to the desired characteristic to provide a filter having infinite Q factor elements and having a theoretical characteristic corresponding to the desired characteristic transformed to compensate for the difference between infinite Q and finite Q factor elements.

According to a further aspect of the invention, there is provided a filter manufactured according to a method or using an apparatus as defined above.

This has the advantage of enabling the realisation of a filter having lower Q value components than in the case of the prior art, which in turn enables the construction of a more compact filter.

According to a further aspect of the invention, there is provided a filter comprising first and second resonators interconnected by a quadruplet of impedance inverters, a ladder network connected to the quadruplet of impedance inverters via a series resistor and comprising a plurality of further resonators, wherein adjacent further resonators of the ladder network are coupled to each other by respective impedance inverters.

In a preferred embodiment, the filter is a reflection mode filter.

The filter is preferably a microwave filter.

A filter may be a bandstop and/or a band pass filter.

Preferably, the step of applying said algorithm comprises shifting the pole/zero plot of the desired filter characteristic by a constant amount.

BRIEF DESCRIPTION OF THE DRAWINGS

A preferred embodiment of the invention will now be described, by way of example only and not in any limitative sense, with reference to the accompanying drawings, in which.

Figure 1:
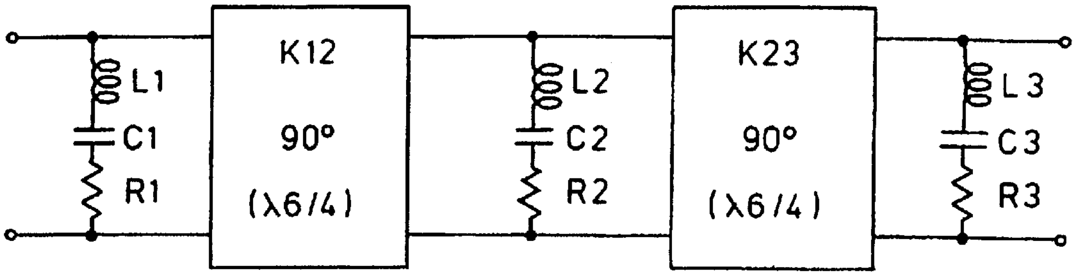
PRIOR ART FIG. 1
FIG. 1 shows a conventional bandstop filter.

The circuit elements in the drawings labelled $L_n$, $C_n$ and $R_n$ represent inductors, capacitors, and resistors, respectively. The elements $K_n$ represent impedance inverters. The elements $G_n$ represent resistance factors.

DETAILED DESCRIPTION OF THE INVENTION

Figure 2:
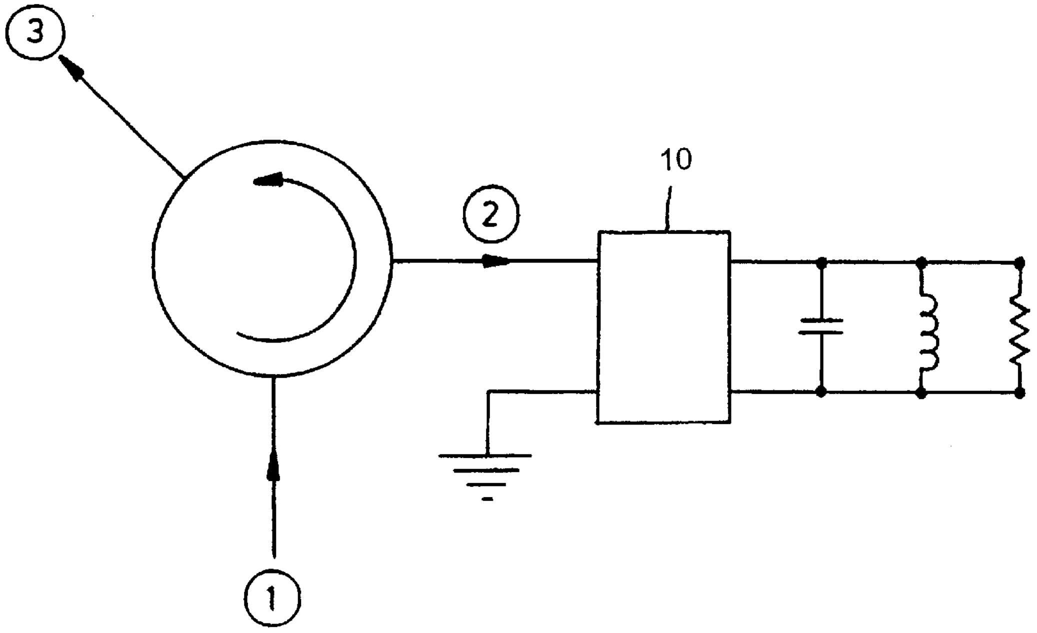
FIG. 2 shows a reflection mode filter comprising a low loss circulator connected to an input of a microwave band pass resonator.

Referring to FIG. 2, there is shown a resonant circuit with finite loss which is coupled to one of the ports of a circulator. The transmission characteristic from ports 1 to 3 is the reflection coefficient from the network 10 connected at port 2. If the input coupling to the resonant circuit is adjusted so that the resistive part of its input impedance is matched to the circulator, then at resonance all power supplied at port 1 will emerge at port 2 and be absorbed in the resistive part of the resonator.

Hence there is no transmission to port 3 and the 1–3 transmission characteristic is that of a resonator with infinite unloaded Q. For a resonator of centre frequency fo and 3 dB bandwidth B the unloaded Q is given by $$Qu = \frac{2fo}{B} \tag{1}$$

For example, if B=250 KHz and fo=1 GHz, then Qu=8000. It can therefore be seen that the previously considered specification can be met with much lower Q resonators, with a consequent reduction in physical size, provided that a design procedure for multi-element filters is available.

Figure 3:
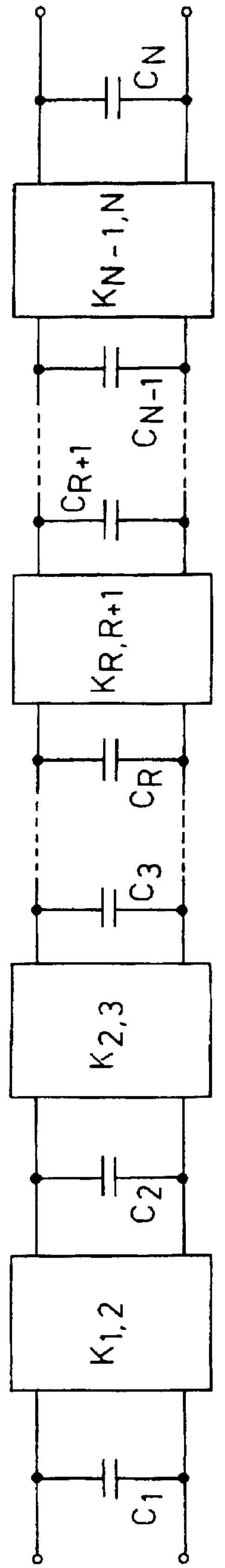
FIG. 3 shows a lossless low pass ladder network.

In order to provide such a design procedure, the magnitude squared of the input reflection coefficient of a lossless lowpass prototype filter may be expressed as $$|S_{11}(j\omega)|^2 = \frac{F_N^2(\omega)}{1 + F_N^2(\omega)}$$

Where $F_n$ ($\omega$) is the characteristic function for a Butterworth, Chebychev, Elliptic Function or other prototype network. This reflection coefficient may readily be synthesised as a lossless lowpass ladder network which is terminated in a resistor as shown in FIG. 3. In order to include eventual resonator losses we can multiply by an arbitrary constant K to yield;

$$|S_{11}(j\omega)|^2 = \frac{KF_N^2(\omega)}{1 + F_N^2(\omega)}$$

Figure 4:
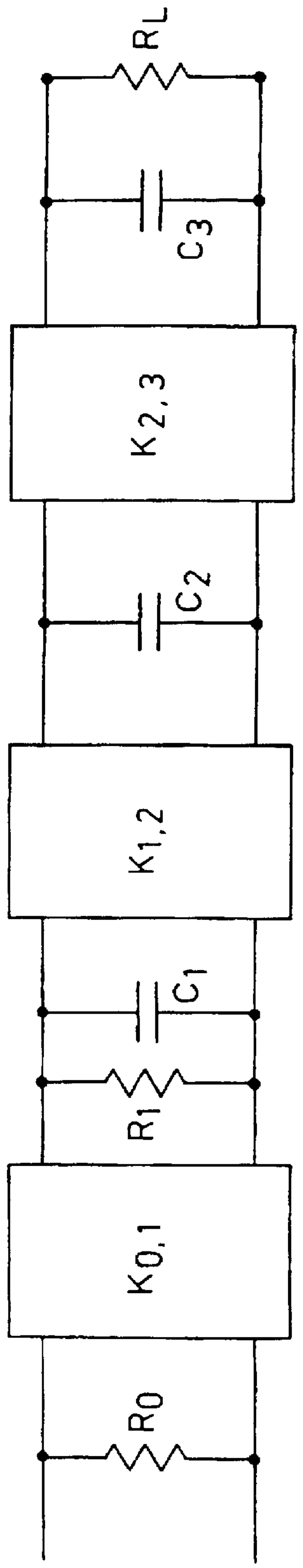
FIG. 4 shows a network comprising a resistive attenuator followed by a lossless ladder network in which N=3.

This may now be synthesised as a resistive attenuator followed by a lossless ladder network which in turn is terminated in a resistor, as shown in FIG. 4.

The resultant network now contains dissipative elements. However, these are not distributed throughout the Nth degree network but remain concentrated at the input. A network containing lossy elements is required so that the required response can be achieved using finite Q resonators.

In order to achieve this, compensation is made for eventual resonator loss by shifting the poles and zeros of $S_{11}$ (p) towards the j$\omega$ axis by a constant amount $\alpha$, i.e.

$$p \rightarrow p - \alpha$$

Thus for $$S_{11}(p) = \frac{KN(p)}{D(p)}$$

Then $$S_{11}(p - \alpha) = \frac{KN(p - \alpha)}{D(p - \alpha)} \tag{1}$$

The reflection coefficient given in (1) may now be synthesised as one port impedance function. First the maximum value of K must be uniquely determined for any specific value of $\alpha$, so that the resultant network is passive and has minimum loss for a given value of $\alpha$.

The specific frequencies $\omega_o$ and values of K are then determined such that:

$$|S_{11}(p-\alpha)|^2=1$$

and $$\frac{d}{d\omega}|S_{11}(p - \alpha)|^2 = 0$$

are simultaneously satisfied with the minimum value of K. Having found the values $\omega_o$ and $\alpha$ then formulate $$S_{11}(p - \alpha) = \frac{KN(p - \alpha)}{D(p - \alpha)} = \frac{N_1(p)}{D_1(p)}$$

The input impedance Zin (p) may now be found from $$Zin(p) = \frac{D_1(p) + N_1(p)}{D_1(p) - N_1(p)}$$

Zin has a transmission zero at $\omega_o$ and thus cannot be synthesised as a ladder network.

However any positive real function may be synthesised using Brunes' Procedure as set out in O Brune. "Synthesis of a Finite Two-Terminal Network whose Driving Point Impedance is a Prescribed Function of Frequency". Journal of Maths and Physics, Vol X no 3, 1931, p 191.

Given $$Yin(p) = \frac{1}{Zin(p)}$$

and evaluating Yin at p=j$\omega_o$ it is found that this is a pure susceptance. This is a consequence of the network being purely reflective at that frequency. This susceptance B will be negative i.e.

$$Yin\ (j\omega o) = -jB$$

Extracting a shunt negative capacitor of value $-C_1$ from Yin provides $$Y_1(p)=Yin(p)+C_1p$$

Observing that $Y_1$ is one degree higher in p than Yin then since Yin (j$\omega_o$) was purely imaginary, $Y_1$ must be equal to zero at this frequency. Consequently $Y_1$ (p) must have a quadratic factor at p=±j$\omega_o$.

Thus $$Y_1(p) = (p^2 + \omega_o^2)\frac{N(p)}{D(p)}$$

Inverting $Y_1(p)$ to form $Z_1(p)$ a series branch composed of a parallel tuned circuit can be extracted, ie $$Z_1(p) = \frac{D(p)}{(p^2 + \omega_o^2)N(p)} = \frac{Ap}{p^2 + \omega_o^2} = Z_2(p)$$

A is the residue of $Z_1(p)$ at $p=j\omega_o$. Inverting $Z_2(p)$ to obtain $Y_2(p)$ then a shunt capacitor may be extracted from $Y_2(p)$ as follows:

$$C_3 = \frac{Y_2(p)}{p}\ p = \infty$$

and $$Y_3(p)=Y_2(p)-C_3p$$

Forming $$Z_4(p) + \frac{1}{Y_3(p)}.$$

A series resistor equal in value to the minimum real part of $Z_4(p)$ must now be extracted. This may be evaluated from the minimum value of the even part of $Z_4(p)$ (min $Ev(Z_4(p))$).

Thus $$Z_5(p)=Z_4(p)-R$$

where $$R=\min Ev(Z_4(p))$$

In most cases the minimum value of $Z_4(p)$ will occur at $\omega=\infty$ and the remaining network may be synthesised as a lossy ladder network.

Figure 5:
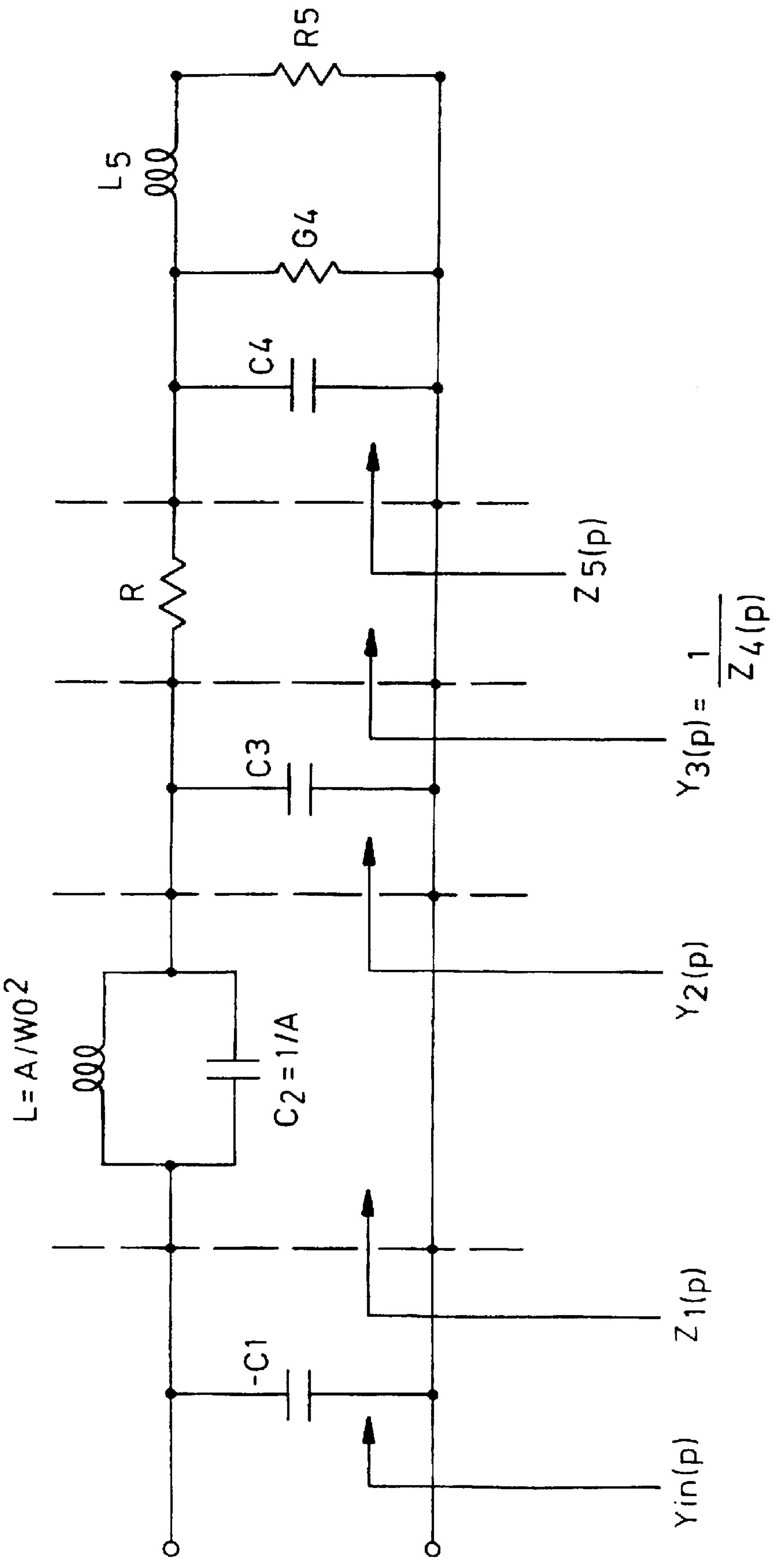
FIG. 5 shows a complete synthesis cycle for a degree 4 network.

The complete synthesis cycle is shown for a degree 4 network in FIG. 5.

It is important to note that the network shown in FIG. 5 is not immediately suitable for realisation using microwave resonators. However, it may readily be transformed into the network of FIG. 6 which consists entirely of inverters $K_1$, $K_2$, $K_3$, and $K_4$, capacitors $C_4$ and $C_5$ and resistor R.

Figure 6:
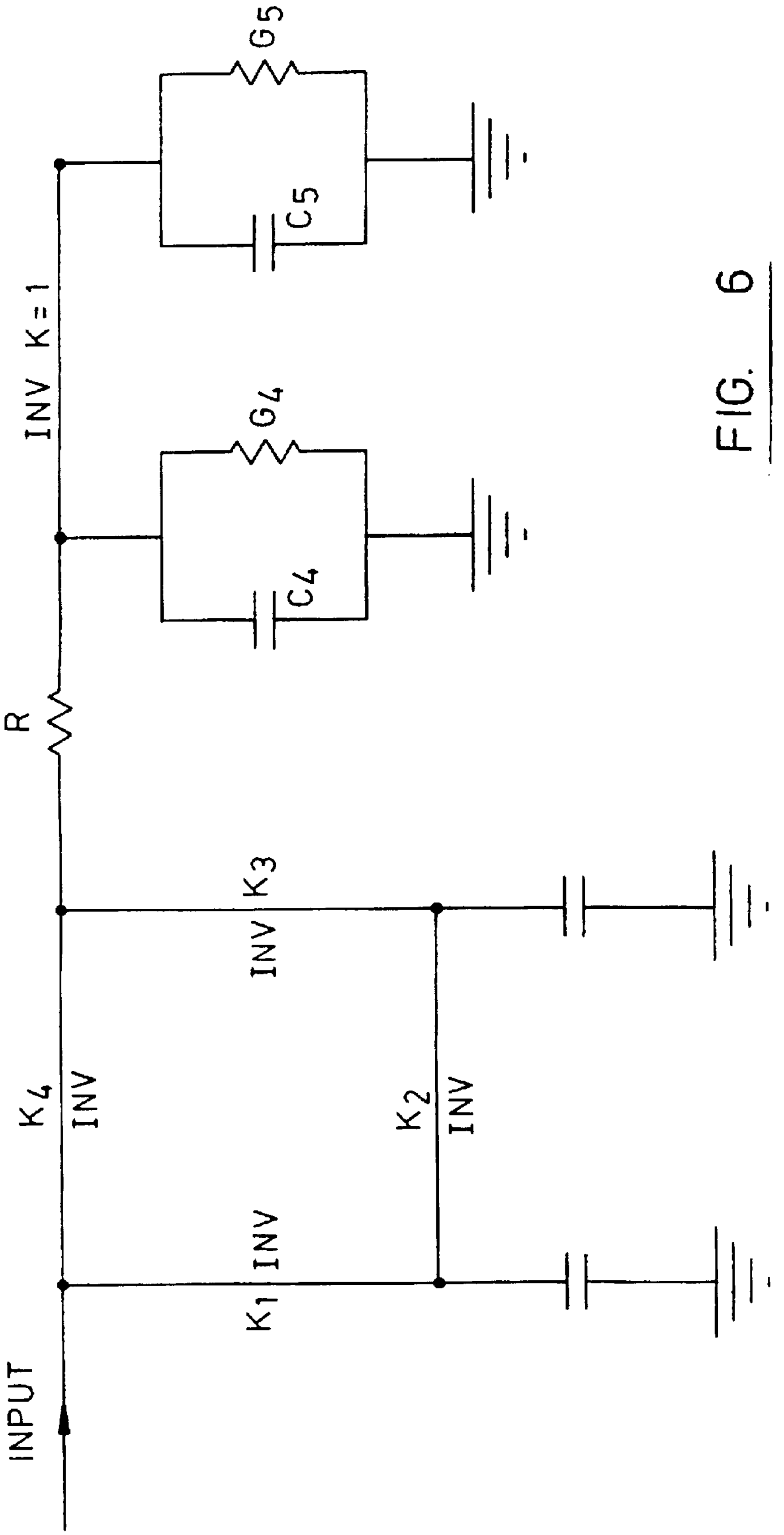
FIG. 6 shows a network corresponding to the network of FIG. 5 modified by the replacement of the first four elements shown in FIG. 5 by a quadruplet of impedance inverters and two capacitors.

The capacitors shown in FIG. 6 are initially lossless but are transformed into finite Q elements by the final simple modification.

$$p \rightarrow p+\alpha$$

The resultant lowpass prototype network may then be converted into a bandpass network by applying the appropriate transformation for any particular type of resonator.

EXAMPLE

The procedure outlined has been applied successfully to the design of a bandstop filter with specification as outlined above.

Figure 7:
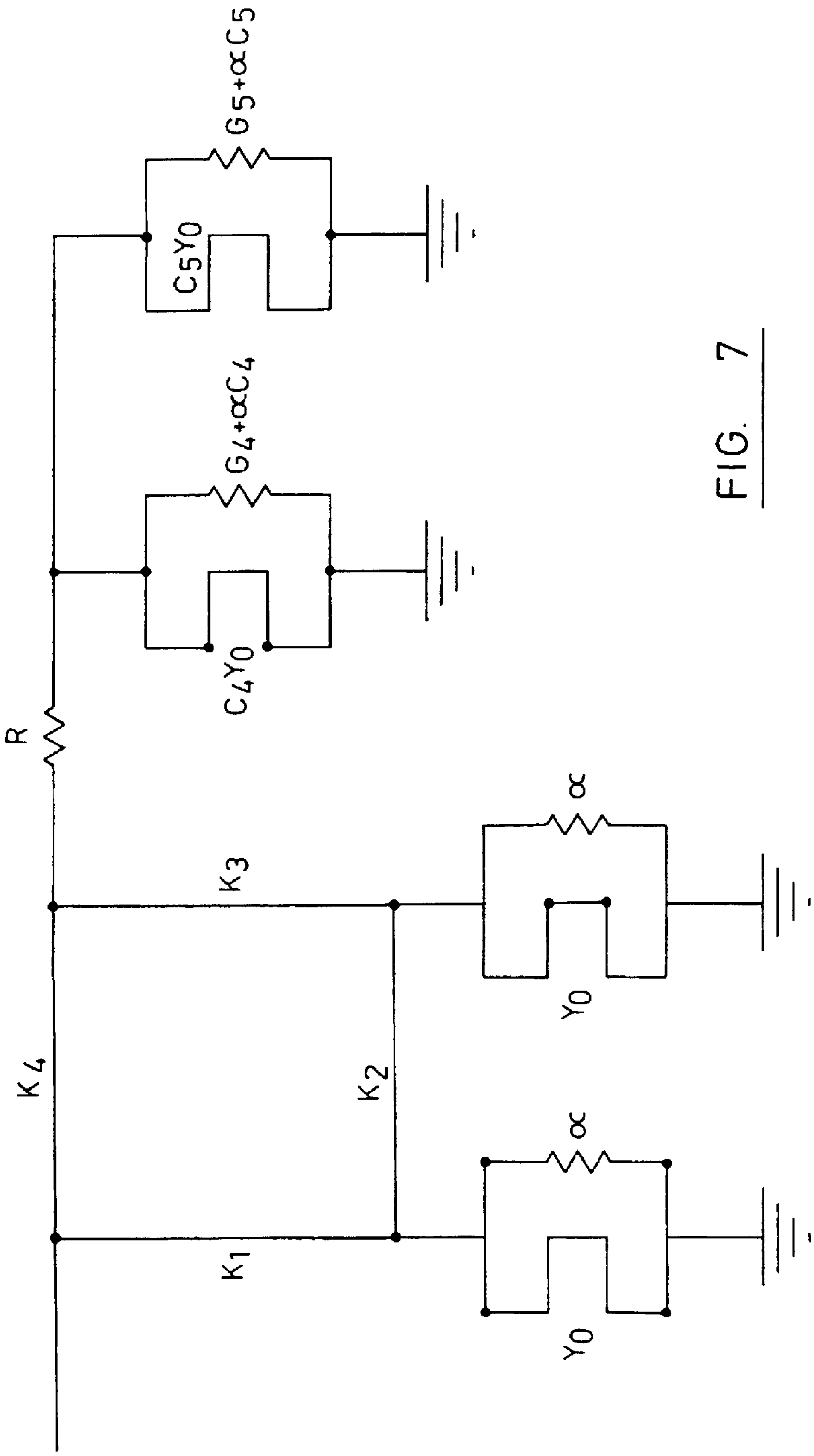
FIG. 7 shows a reflection mode band stop microwave filter.
Figure 8:
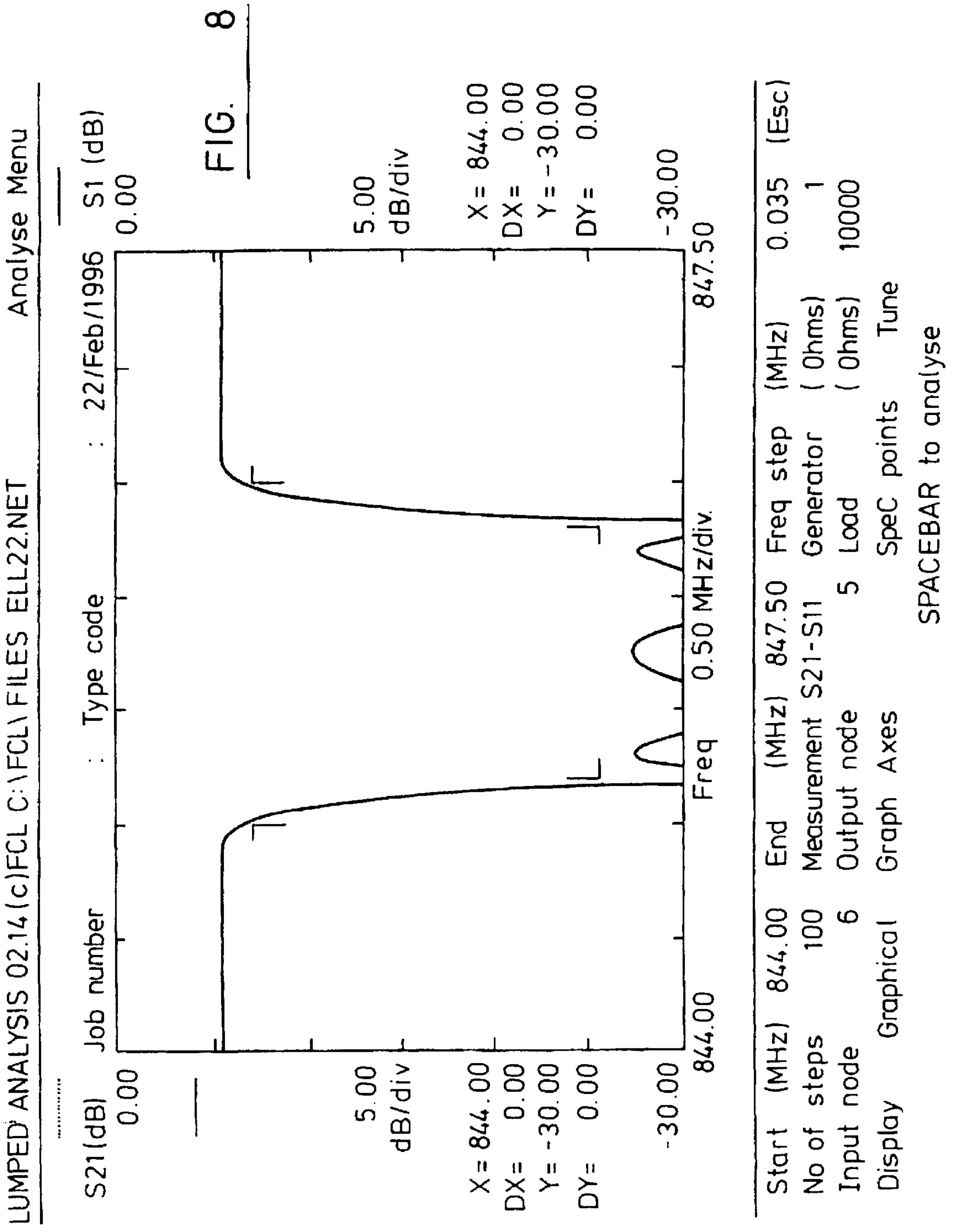
FIG. 8 shows the simulated frequency response of the filter of FIG. 7.
Figure 9:
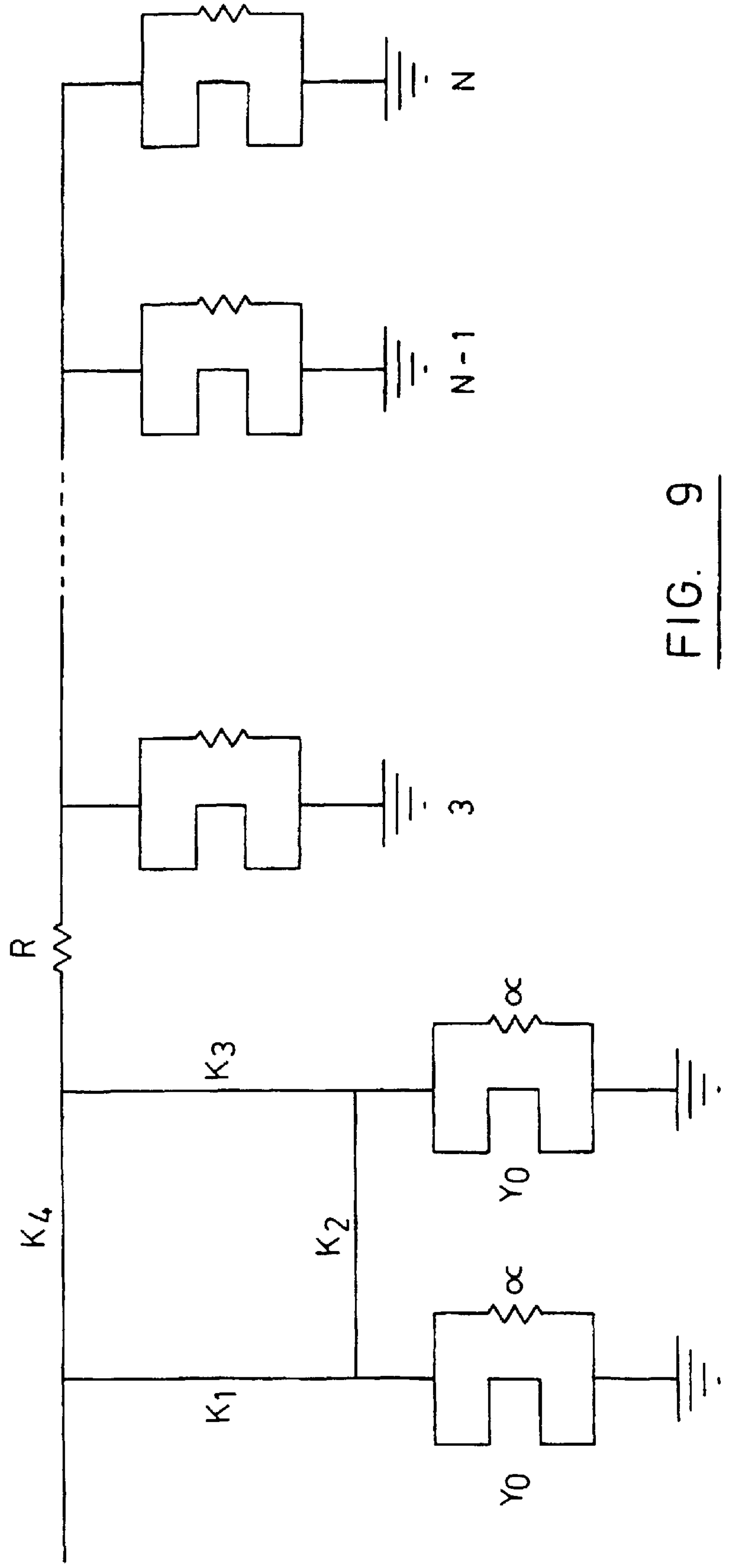
FIG. 9 shows a general Nth degree circuit for the band stop reflection mode filter of FIG. 7.
Figure 10:
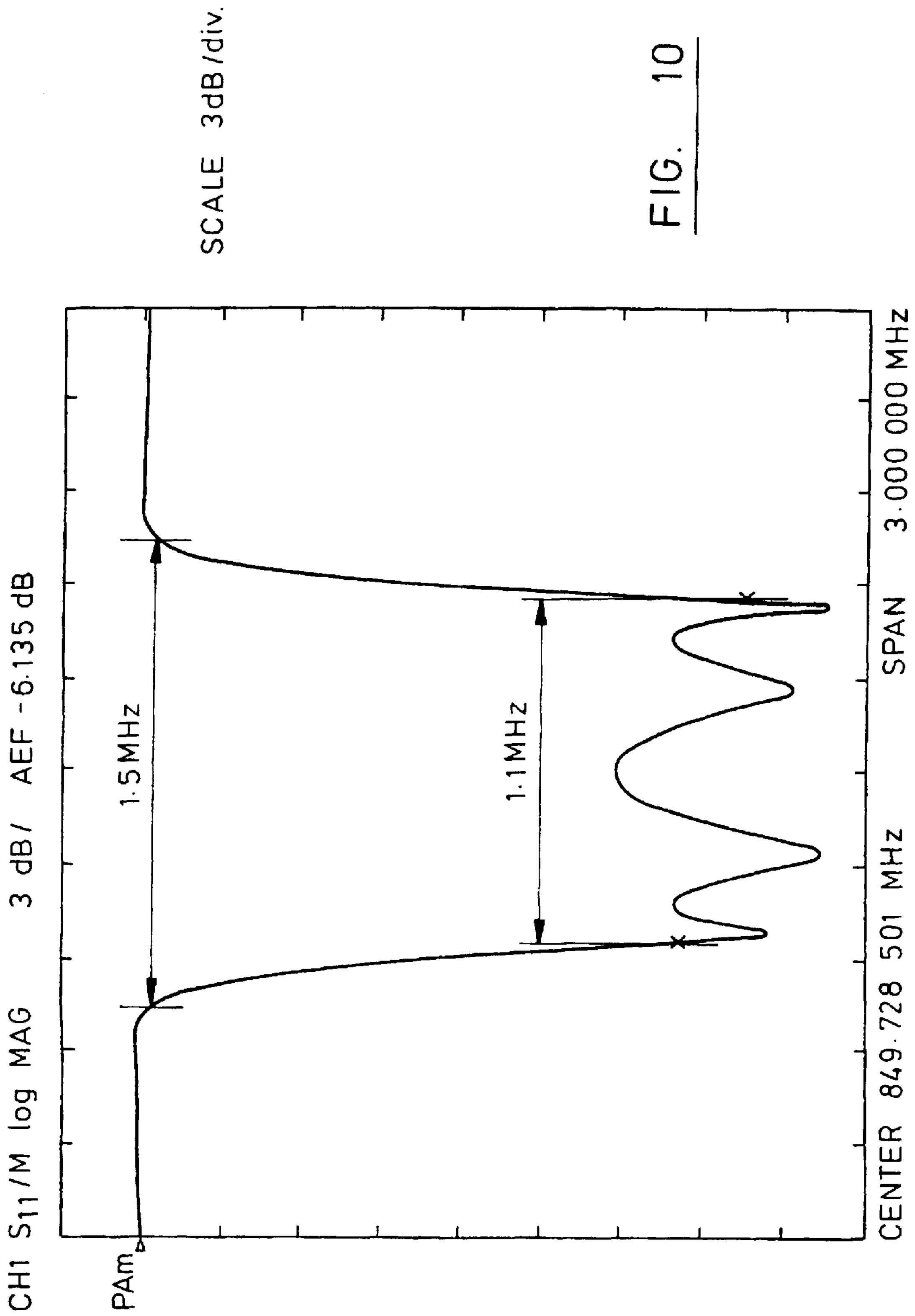
FIG. 10 shows the measured frequency response of an actual filter.

A fourth degree Elliptic Function Filter was synthesised. The choice of $\alpha$ was 0.093 corresponding to approximately 6 dB out of band loss. The resultant network is shown in FIG. 7. The simulated response of this network is shown in FIG. 8, from which it can be seen that the response achieves the desired specification. This actual filter has been constructed using coaxial resonators. The measured performance characteristics are shown in FIG. 10 and are in excellent agreement with theory.

It will be appreciated by persons skilled in the art that the above embodiment has been described by way of example only, and not in any limited sense, and that various alterations and modifications are possible without departure from the scope of the invention as defined by the appended claims.

What is claimed is:

1. A reflection mode filter network having a filter characteristic comprising a reflection function and a constant loss off-set, the reflection function being substantially identical to a predetermined reflection function of a theoretical filter including infinite Q factor resonators, the network having an input connected to an input node of a first inverter and the first inverter having an output node connected in series with a resistance, and having a finite Q-factor resonator connected in parallel between the input and output nodes by a second and a third inverter, and a ladder network including a finite Q factor resonator attached in series with the resistance.

2. A reflection mode filter network as claimed in claim 1, and having a second finite Q-factor resonator connected in parallel across the first inverter via the third inverter and a fourth inverter which is connected to the output node of the first inverter.

3. A reflection mode filter including a reflection mode filter network as claimed in claim 2 and including a three port circulator attached to the input of the reflection mode filter network and having its impedance matched to the resistive part of the input impedance of the reflection mode filter network so that the reflection mode filter acts as a reflection mode filter.

4. A reflection mode filter as claimed in claim 3, in which the reflection mode filter is a bandstop filter.

5. A reflection mode filter as claimed in claim 3, in which the reflection mode filter is a bandpass filter.

6. A reflection mode filter as claimed in claim 3, which is a microwave filter.

7. A reflection mode filter including a reflection mode filter network as claimed in claim 1, and including a three port circulator attached to the input of the reflection mode filter network and having its impedance matched to the resistive part of the input impedance of the reflection mode filter network so that the reflection mode filter acts as a reflection mode filter.

8. A reflection mode filter as claimed in claim 7, in which the reflection mode filter is a bandstop filter.

9. A reflection mode filter as claimed in claim 7, in which the reflection mode filter is a bandpass filter.

10. A reflection mode filter as claimed in claim 7, which is a microwave filter.

11. A method of manufacturing a reflection mode filter network comprising finite Q-factor resonators and having a desired filter characteristic of a reflection function with a constant loss off-set in which the reflection function is substantially identical to the reflection function of a theoretical filter comprising infinite Q factor resonators and comprising the steps of:

specifying the desired reflection function;

transforming the desired reflection function by multiplying by a constant corresponding to loss of the filter network and shifting the poles and zeros of a plot of the reflection function on the imaginary/real plane towards the imaginary axis by a real amount;

synthesizing a theoretical filter network including lossless resonators and having the transformed reflection function;

converting the theoretical filter network into an equivalent network comprising inverters, capacitors and resistors;

re-transforming the reflection function of the converted theoretical filter network and shifting the poles and zeros of a plot of the reflection function away from the imaginary axis of the imaginary/real plane by the real amount so as to provide a low pass prototype reflection mode filter network having the desired reflection function and a constant loss offset;

applying a frequency transformation to the low pass prototype reflection mode filter network to provide a reflection mode filter network configuration of electrical components, and specific values of the electrical components, having the desired filter characteristic; and assembling electrical components selected from inverters, capacitors and resistors according to the reflection mode filter network configuration and having the specific values to provide a reflection mode filter network having finite Q-factor resonators and the desired filter characteristic.

12. A reflection mode filter manufactured according to the method of claim 11.

13. A method of manufacturing a reflection mode filter including the steps of manufacturing a reflection mode filter network as claimed in claim 11, and the step of attaching a three port circulator to an input port of the reflection mode filter network and providing an input port to the circulator and an output port from the circulator and matching the resistive part of the input impedance of the reflection mode filter network to the circulator.

14. A reflection mode filter network manufactured according to the method of claim 13.

15. A reflection mode filter as claimed in claim 14, in which the filter is a microwave filter.

* * * * *